United States Patent
Lu et al.

(10) Patent No.: US 8,242,784 B2
(45) Date of Patent: Aug. 14, 2012

(54) QUALIFYING CIRCUIT BOARD MATERIALS

(75) Inventors: Vinh B. Lu, Austin, TX (US); Bhyrav M. Mutnury, Austin, TX (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 12/632,499

(22) Filed: Dec. 7, 2009

(65) Prior Publication Data

US 2011/0133761 A1 Jun. 9, 2011

(51) Int. Cl.
*G01R 31/08* (2006.01)

(52) U.S. Cl. ............ 324/527; 324/535; 324/750.01; 324/551; 324/658; 324/674; 324/681; 324/612; 324/616

(58) Field of Classification Search .......... 324/527, 324/535, 750.01, 551, 658, 674, 681, 612, 324/616
See application file for complete search history.

(56) References Cited

U.S. PATENT DOCUMENTS

| | | | |
|---|---|---|---|
| 4,012,646 A * | 3/1977 | Fang et al. | 326/3 |
| 4,523,198 A | 6/1985 | Clapp | |
| 6,121,778 A * | 9/2000 | Moore | 324/619 |
| 6,326,793 B1 * | 12/2001 | Moore | 324/615 |
| 6,326,797 B2 | 12/2001 | Caggiano et al. | |
| 6,445,264 B1 | 9/2002 | Pond | |
| 6,452,502 B1 * | 9/2002 | Dishongh et al. | 340/653 |
| 6,560,724 B1 * | 5/2003 | Ganske | 714/43 |
| 6,724,268 B2 | 4/2004 | Takahashi | |
| 6,727,712 B2 * | 4/2004 | Sabey | 324/763.01 |
| 6,924,637 B2 | 8/2005 | Casey et al. | |
| 6,977,507 B1 * | 12/2005 | Pannell et al. | 324/534 |
| 7,173,438 B2 * | 2/2007 | Pooranakaran et al. | 324/678 |
| 7,209,065 B2 | 4/2007 | Wood | |
| 7,307,485 B1 * | 12/2007 | Snyder et al. | 331/150 |
| 7,310,000 B2 * | 12/2007 | Ong | 324/750.01 |
| 7,333,346 B2 | 2/2008 | Miyagawa et al. | |
| 7,521,941 B2 * | 4/2009 | Ely et al. | 324/678 |
| 7,756,197 B1 * | 7/2010 | Ferguson et al. | 375/224 |
| 7,884,621 B2 * | 2/2011 | Snyder | 324/658 |

(Continued)

FOREIGN PATENT DOCUMENTS

JP 11145628 A2 5/1999

OTHER PUBLICATIONS

W. Oskay, "A Single Sided Circuit Board," Feb. 4, 2009, www.evilmadscientist.com/article.php/mobiuscircuit.

(Continued)

*Primary Examiner* — Huy Q Phan
*Assistant Examiner* — Lamarr Brown
(74) *Attorney, Agent, or Firm* — Thomas E. Tyson; Law Office of Jim Boice

(57) ABSTRACT

A test structure for testing electrical properties of a material comprises a first loop and a second loop, which are connected to form a closed test loop. A signal generator, for generating a test signal, is coupled to the first loop and the second loop. A signal propagation switching logic is coupled to the first loop and to the second loop for alternatingly flipping the test signal between the first and second loops, such that the test signal moves uninterrupted through the closed test loop. A probe logic detects any degradation of the test signal as the test signal travels along the closed test loop.

6 Claims, 5 Drawing Sheets

U.S. PATENT DOCUMENTS

| | | | |
|---|---|---|---|
| 2002/0131916 A1* | 9/2002 | Nelson et al. | 422/186.04 |
| 2003/0001587 A1* | 1/2003 | Arabi | 324/533 |
| 2006/0155843 A1* | 7/2006 | Glass et al. | 709/224 |
| 2006/0267599 A1* | 11/2006 | Pooranakaran et al. | 324/681 |
| 2007/0222473 A1 | 9/2007 | Eto | |
| 2007/0279151 A1* | 12/2007 | Miller | 333/164 |
| 2008/0068030 A1* | 3/2008 | Snyder | 324/658 |
| 2008/0164885 A1* | 7/2008 | Hemingway et al. | 324/628 |
| 2008/0258780 A1 | 10/2008 | Wood | |
| 2009/0037131 A1* | 2/2009 | Hess et al. | 702/117 |
| 2009/0108863 A1* | 4/2009 | Gonzalez et al. | 324/765 |
| 2010/0271057 A1* | 10/2010 | Cannon et al. | 324/750.01 |

OTHER PUBLICATIONS

J. Muller et al. "Technology Benchmarking of High Resolution Structures on LTCC for Microwave Circuits," Elect. Sys. Int. Tech. Conf., vol. 1, Sep. 5-7, 2006, pp. 111-117.

* cited by examiner

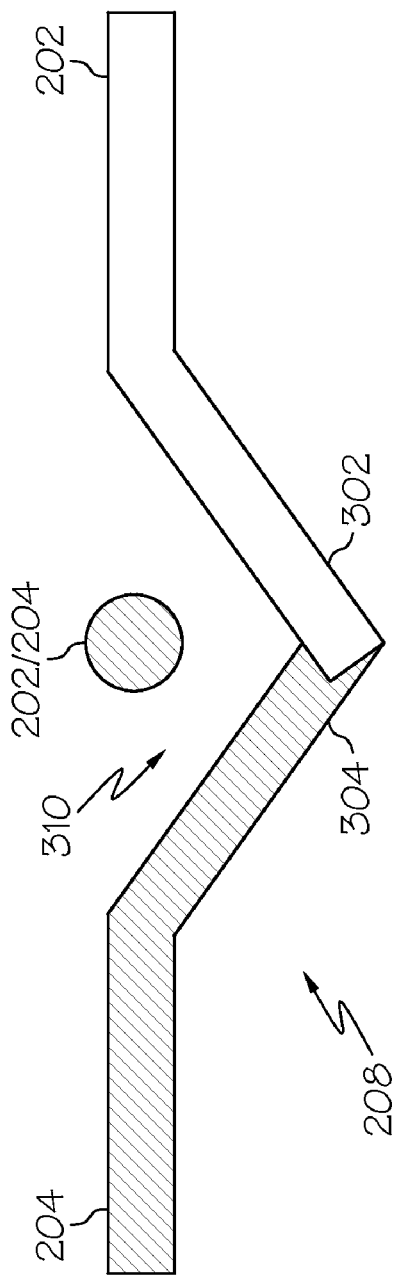
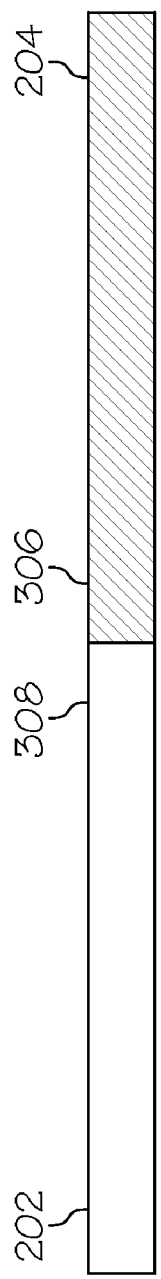
FIG. 3A
FIG. 3B

QUALIFYING CIRCUIT BOARD MATERIALS

BACKGROUND

The present disclosure relates to the field of computers, and specifically to hardware components of computers. Still more particularly, the present disclosure relates to materials used to fabricate hardware components of computers.

BRIEF SUMMARY

One embodiment of the present disclosure presents a system that utilizes a test structure for testing signal degradation as a signal passes through a first loop and a second loop, which are connected to form a closed test loop. A signal generator, for generating a signal, is coupled to the first loop and the second loop. A signal propagation switching logic is coupled to the first loop and to the second loop for alternatingly flipping the signal between the first and second loops, such that the signal moves uninterrupted through the closed test loop. A probe logic detects any degradation of the signal as the signal travels along the closed test loop.

One embodiment presents a method of testing a signal degradation caused by properties of insulating material between conducting material. The method comprises: coupling a test structure to a processor, wherein the test structure comprises: a first loop of conducting material, wherein the first loop has a first end and a second end; a second loop of the conducting material, wherein the second loop has a third end and a fourth end; a closed test loop of the conducting material made up of the second end connected to the third end and the first end connected to the fourth end; a signal generator coupled to the first loop and the second loop; a signal propagation switching logic coupled to the first loop and to the second loop, wherein the signal propagation switching logic alternatingly flips a test signal between the first and second loops to permit the test signal to move through the closed test loop. A probe logic detects a degradation of the test signal as the test signal travels along the closed test loop. The signal generator initiates the test signal at the first end of the first loop. The probe logic detects a degraded test signal at the second end of the first loop. The signal propagation switching logic then flips the degraded test signal to the first end of the second loop while flipping a second end of the second loop to zero. The probe logic detects a further degraded test signal at the second end of the second loop, and the signal propagation switching logic flips the further degraded test signal to the first end of the first loop while flipping the second end of the first loop to zero. The detecting and flipping are repeated until a testing cycle is completed, wherein the degraded and further degraded test signals result from signal leakage from the conducting material into the insulating material.

In one embodiment, the present disclosure presents a method of testing a signal degradation caused by properties of the conducting material. The method comprises coupling a test structure to a processor, wherein the test structure comprises: a first loop having a first end and a second end; a second loop having a third end and a fourth end; a closed test loop made up of the second end connected to the third end and the first end connected to the fourth end; a signal generator coupled to the first loop and the second loop; a signal propagation switching logic coupled to the first loop and to the second loop, wherein the signal propagation switching logic alternatingly flips a test signal between the first and second loops to permit the test signal to move through the closed test loop; and a probe logic for detecting a degradation of the test signal as the test signal travels along the closed test loop. The signal generator initiates the test signal at the first end of the first loop. The probe logic detects a degraded test signal at the second end of the first loop. The signal propagation switching logic flips the degraded test signal to the first end of the second loop while flipping a second end of the second loop to zero. The probe logic then detects a further degraded test signal at the second end of the second loop, and the signal propagation switching logic flips the further degraded test signal to the first end of the first loop while flipping the second end of the first loop to zero. The detecting and flipping are repeated until a testing cycle is completed, wherein the degraded and further degraded test signals resulted from properties of the conducting material.

BRIEF DESCRIPTION OF THE SEVERAL VIEWS OF THE DRAWINGS

FIGS. 3A-B depict additional detail of a first and second loop being connected to form a closed test loop used in the test structure illustrated in FIG. 2A-B.

DETAILED DESCRIPTION

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in one or more computer-readable medium (s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Figure 1:
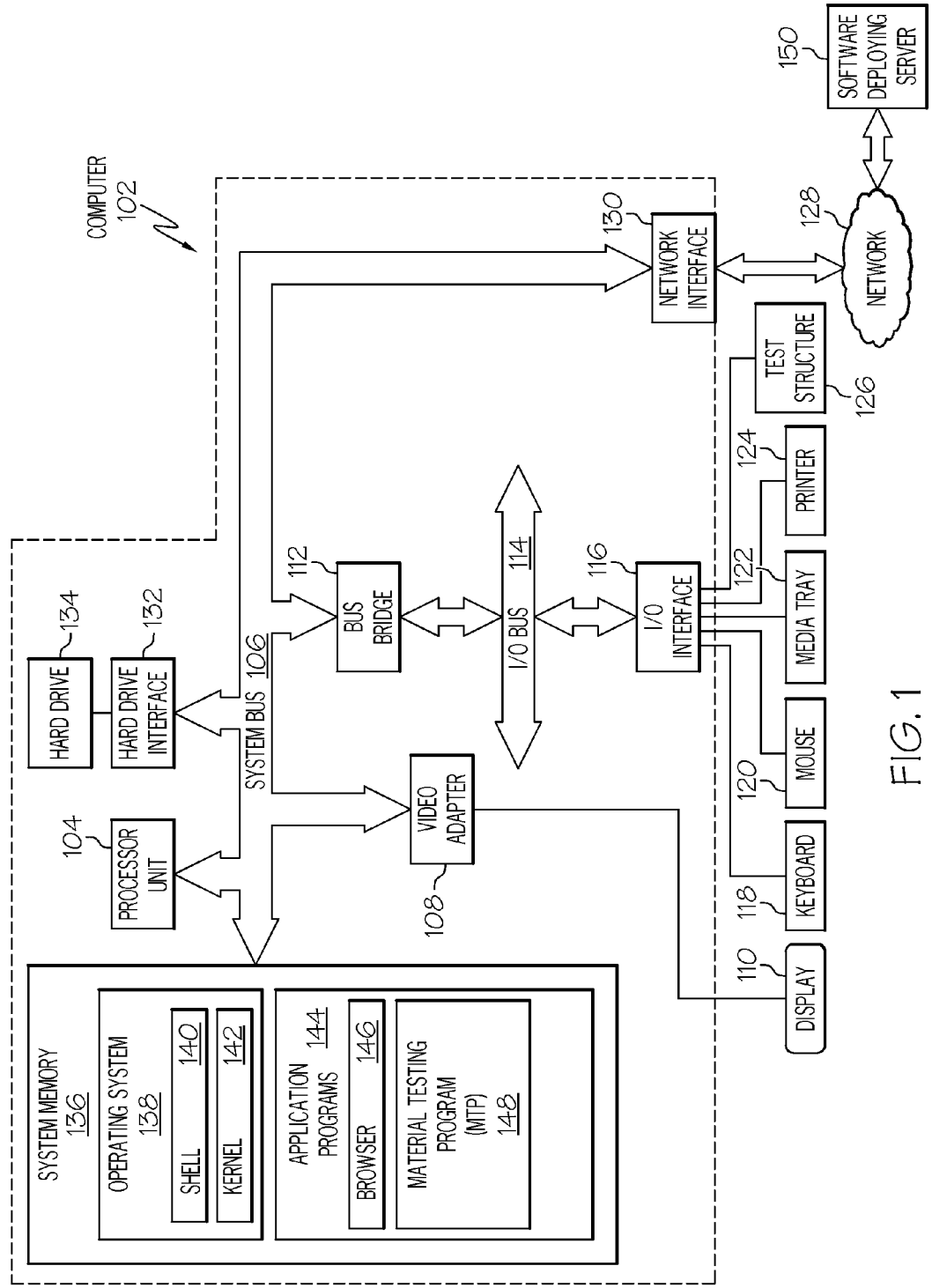
FIG. 1 depicts an exemplary computer that may be used in implementing the present disclosure.

With reference now to the figures, and in particular to FIG. 1, there is depicted a block diagram of an exemplary computer 102, which may be utilized by the present disclosure. Note that some or all of the exemplary architecture, including both depicted hardware and software, shown for and within computer 102 may be utilized by software deploying server 150.

Computer 102 includes a processor unit 104 that is coupled to a system bus 106. Processor unit 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multimedia interfaces, etc.), a printer 124, and a test structure 126. While the format of the ports connected to I/O interface 116 may be any known to those skilled in the art of computer architecture, in a preferred embodiment some or all of these ports are universal serial bus (USB) ports.

As depicted, computer 102 is able to communicate with a software deploying server 150, and alternatively test structure 126 via network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present disclosure will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other described computer systems.

Application programs 144 in computer 102's system memory (as well as software deploying server 150's system memory) also include a material testing program (MTP) 148. MTP 148 includes code for implementing the processes described herein, including those described in FIGS. 2-4. In one embodiment, computer 102 is able to download MTP 148 from software deploying server 150, including in an on-demand basis, such that the code from MTP 148 is not downloaded until runtime or otherwise immediately needed by computer 102. Note further that, in one embodiment of the present disclosure, software deploying server 150 performs all of the functions associated with the present disclosure (including execution of MTP 148), thus freeing computer 102 from having to use its own internal computing resources to execute MTP 148.

The hardware elements depicted in computer 102 are not intended to be exhaustive, but rather are representative to highlight essential components required by the present disclosure. For instance, computer 102 may include alternate memory storage devices such as magnetic cassettes, digital versatile disks (DVDs), Bernoulli cartridges, and the like. These and other variations are intended to be within the spirit and scope of the present disclosure.

Figure 2A:
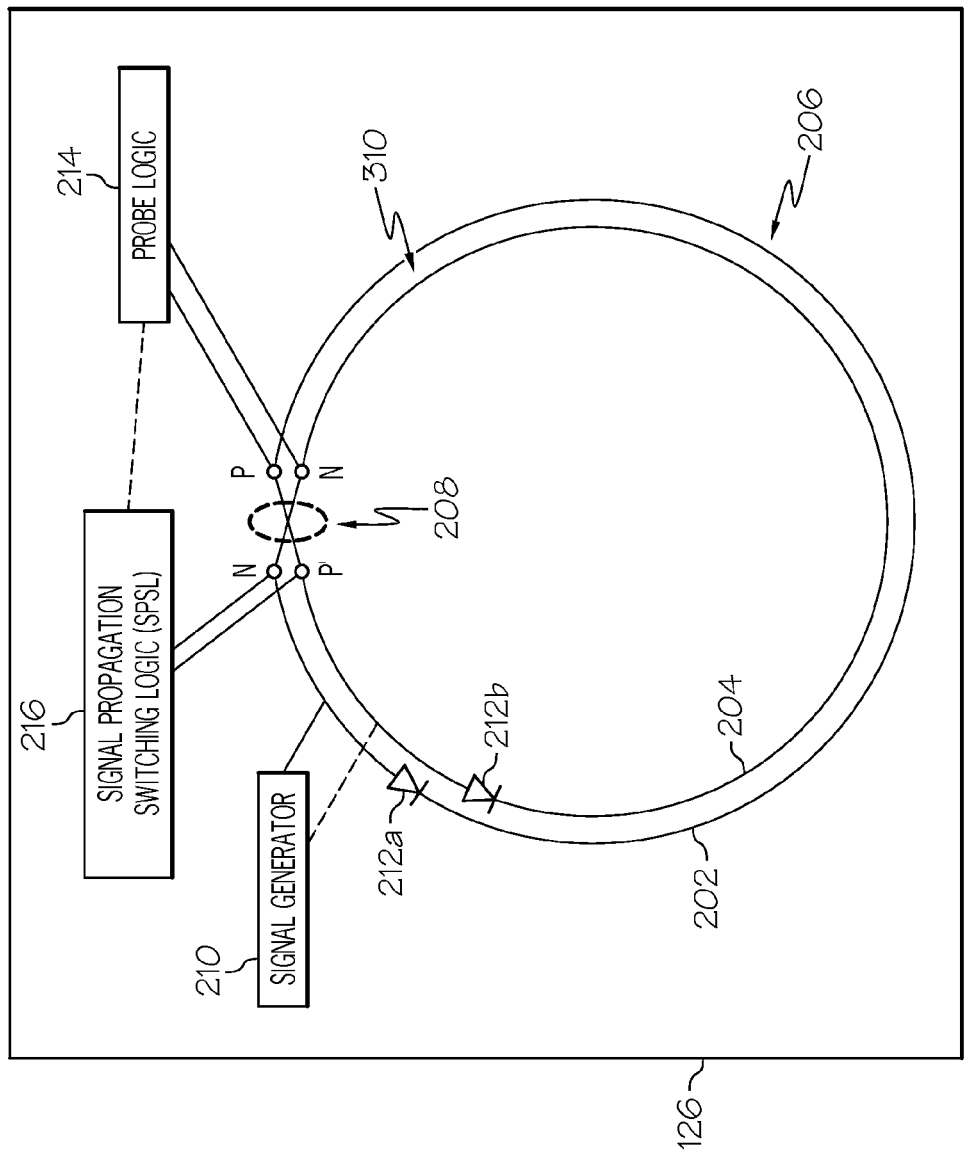
FIGS. 2A-B illustrate an exemplary embodiment of a novel test structure as described in the present disclosure.
Figure 2B:
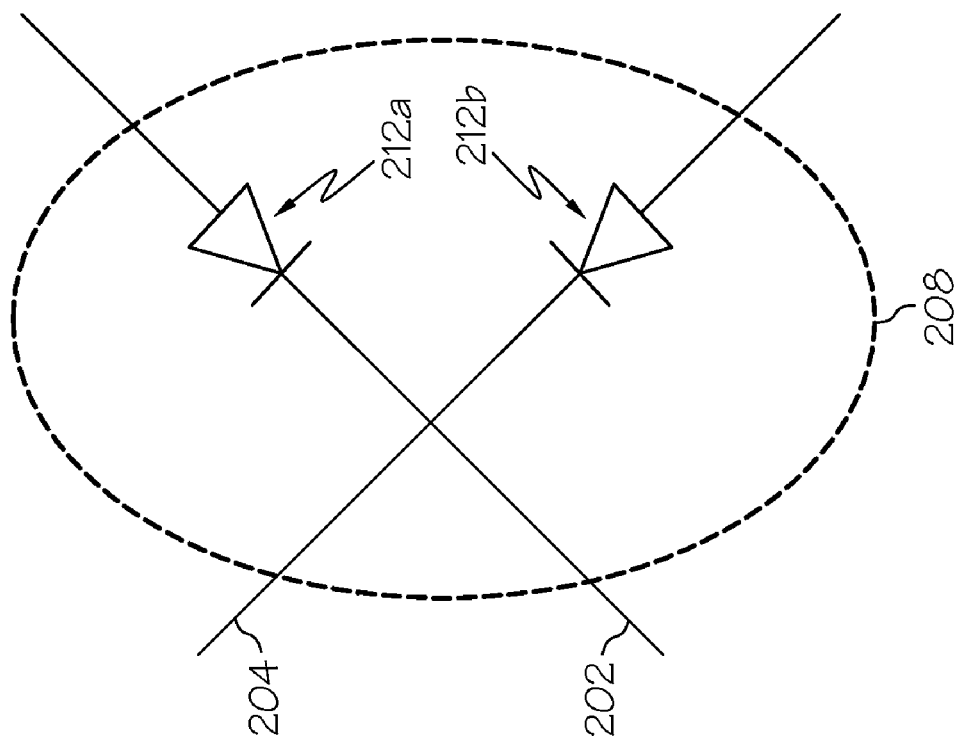

With reference now to FIG. 2A, additional detail of the test structure 126 shown in FIG. 1 is presented. Test structure 126 includes a first loop 202 and a second loop 204, which when connected in a manner described herein in FIGS. 3A-B, make up a closed test loop 206. First loop 202 and second loop 204, which are initially open loops, are joined in area 208 without contacting each other. Each of the loops has two ends. For purposes of descriptive clarity, assume that the two ends of the first loop 202 are named first end 308 and second end 302, while the two ends of second loop 204 are named third end 304 and fourth end 306. As shown in FIG. 3A, second end 302 is connected to third end 304, thus connecting first loop 202 to second loop 204. As shown in FIG. 3B, fourth end 306 (from second loop 204) is connected to first end 308 (from first loop 202), thus closing the closed test loop 206. Note that the two loops are separated by an insulating material, which may be a gas, liquid, solid, etc. In one embodiment, however, this insulating material is a dielectric insulation material 310, such as that used in the construction of printed circuit boards (PCBs).

Returning now to FIG. 2A, a signal generator 210 is coupled to one or both of the first and second loops 202/204. Signal generator 210 is capable of putting a signal (e.g., a test signal such as a known voltage) onto one or both of the loops 202/204. In order to make the signal propagation unidirectional, a pair of diodes 212a-b (shown in FIG. 2B) are put in series with their respective loops 202/204. A probe logic 214 is coupled to each of the loops 202/204, as is a signal propagation switching logic (SPSL) 216. As described in further detail herein, the probe logic 214 detects a degradation of the signal, generated by the signal generator 210, as the signal travels along the closed test loop 206. To keep this signal moving through the closed test loop 206, SPSL 216 alternatingly flips the signal between the first and second loops, such that the signal moves uninterrupted through the unending closed test loop 206.

To understand this signal/node flipping, consider Table I, in which the signal is an initial voltage of 500 mV.

TABLE I

| Time | Node N' (mV) | Node P (mV) | Node P' (mV) | Node N (mV) |
|---|---|---|---|---|
| T0 | 500 | 0 | 0 | 0 |
| T1 | 500 | 450 | 0 | 0 |
| T2 | 0 | 0 | 450 | 0 |
| T3 | 0 | 0 | 450 | 400 |
| T4 | 400 | 0 | 0 | 0 |
| T5 | 400 | 350 | 0 | 0 |
| T6 | 0 | 0 | 350 | 0 |
| T7 | 0 | 0 | 350 | 300 |
| T8 | 300 | 0 | 0 | 0 |
| T9 | 300 | 250 | 0 | 0 |
| T10 | 0 | 0 | 250 | 0 |
| T11 | 0 | 0 | 250 | 200 |
| T12 | 200 | 0 | 0 | 0 |
| T13 | 200 | 150 | 0 | 0 |
| T14 | 0 | 0 | 150 | 0 |
| T15 | 0 | 0 | 150 | 100 |
| T16 | 100 | 0 | 0 | 0 |
| T17 | 100 | 50 | 0 | 0 |
| T18 | 0 | 0 | 50 | 0 |
| T19 | 0 | 0 | 50 | 0 |
| T20 | 0 | 0 | 0 | 0 |

At time T0, signal generator 210 puts a 500 mV signal on or near node N' of loop 202. At the same time T0, node P' of loop 204 is at 0, such that the voltage is able to propagate (after an initial ramp-up) along loop 202 to node P. At time T1, the voltage at N' is still at 500 mV, but it has decayed during propagation to node P to 450 mV. At time T2, the voltages of nodes P' and N' switch, such that node P' is now at 450 mV, and node N' is at 0. At time T3, the 450 mV at node P' is launched, and decays down to 400 mV at node N. At time T4, N' and P' are switched, such that N' is now at 400 mV and P' is at 0. At time T5, the 400 mV at node N' is launched, and decays down to 350 mV at node P. At time T6, N' and P' are switched, such that P' is at 350 mV and N' is at 0. The process continues (with voltage signals being launched at the odd numbered Ts, and N' and P' switching (flipping) at the even numbered Ts) until all nodes have 0 volts, or the testing cycle ends (time runs out, parameters reached, etc.).

There are several ways in which the node switching described herein (of N' and P', for example) can occur. In one embodiment, probe logic 214 passes the decayed voltage (e.g., the 450 mV at node P at time T1 in Table I) to SPSL 216, which then puts this voltage onto the flipped node (e.g., node P' at time T2 in Table I) for launching. In another embodiment, SPSL 216 "knows" (i.e., has data stored in a register) how long it will take a signal to propagate around loop 202 or loop 204. After the initial launching of a voltage or other electrical signal onto node N', SPSL will automatically switch the non-receiving node to 0 (e.g., node P' at time T4) while switching the receiving node (e.g., node N' at time T4) to the degraded signal (e.g., 400 mV at time T4). In either embodiment, the signal propagates around the closed test loop 206 in a continuous manner.

Figure 4:
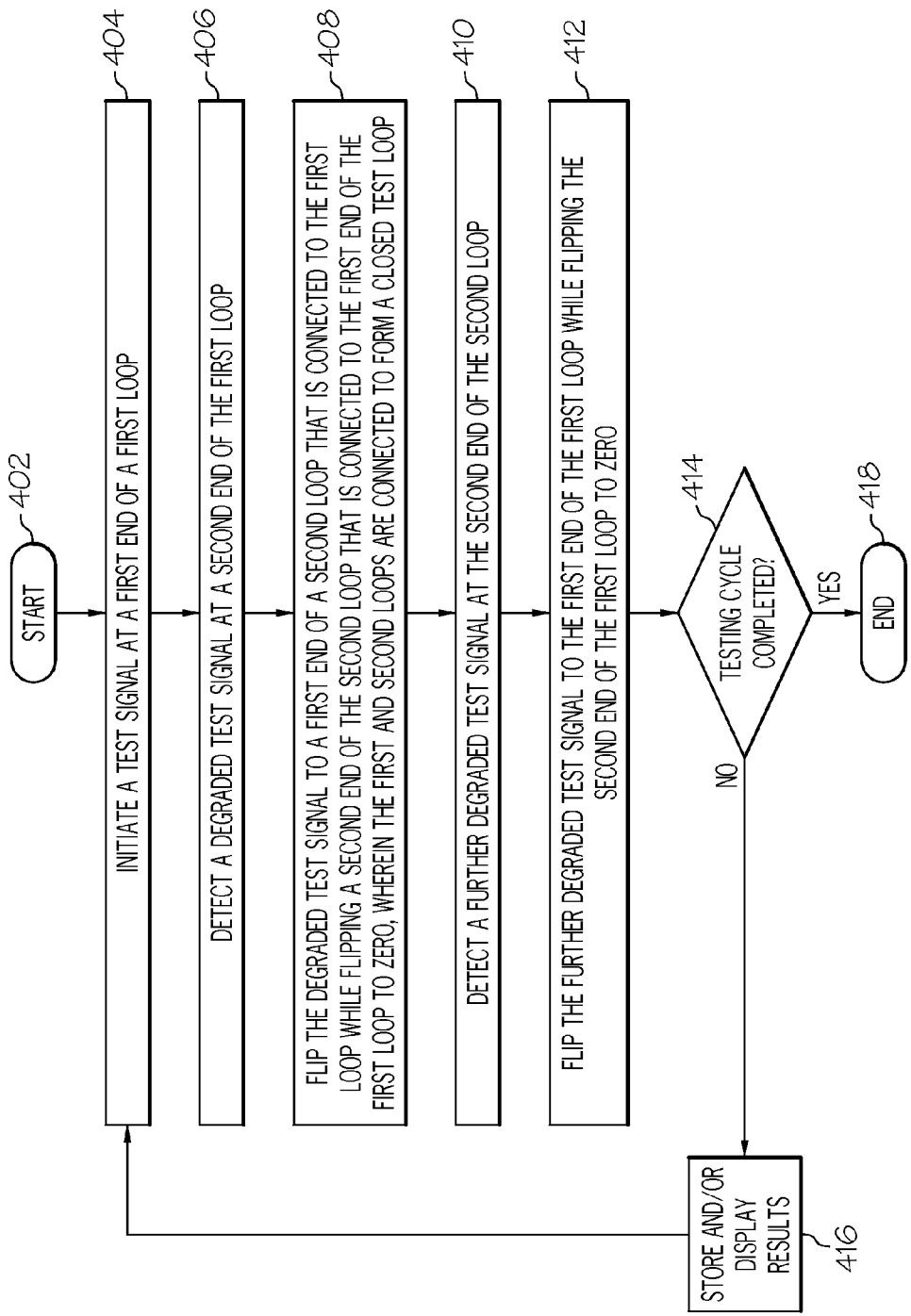
FIG. 4 is a high level flow chart of one or more exemplary steps performed by hardware logic to test the electrical properties of a material.

With reference now to FIG. 4, a high level flow chart of exemplary steps performed by hardware logic to test the electrical properties of a material is presented. After initiator block 402, which may be prompted by the coupling of a test structure to a processor, wherein the test structure comprises the components described herein in exemplary fashion for test structure 126, the signal generator initiates a test signal at the first end of the first loop (block 404). The probe logic then detects a degraded test signal at the second end of the first loop (block 406). The signal propagation switching logic flips the degraded test signal to the first end of the second loop while flipping a second end of the second loop to zero (block 408). The probe logic then detects a further degraded test signal at the second end of the second loop (block 410). The signal propagation switching logic flips the further degraded test signal to the first end of the first loop while flipping the second end of the first loop to zero (block 412). If the testing cycle is not completed (query block 414), the results of the signal degradation are stored and/or displayed on a monitor or printout (block 416), and the processes shown in blocks 404-412 are repeated in a reiterative manner until the testing cycle is complete (query block 414), and the process ends (terminator block 416). Thus, the signal degradation detected indicates how much signal degradation is caused by the conductor and/or the insulation around the conductor.

Note that while closed test loop 206 is depicted as being made up of two loops (202, 204), in one embodiment, closed test loop 206 is made up of more than two loops, resulting in an even smaller radius for closed test loop 206, which makes for an even smaller test structure 126.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims herein are intended to include any structure, material, or act for performing the function in combination with other claimed elements as specifically claimed. The description of various embodiments of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described embodiments of the disclosure of the present application in detail and by reference to illustrative embodiments thereof, it will be apparent that modifications and variations are possible without departing from the scope of the disclosure defined in the appended claims.

What is claimed is:

1. A method of testing a signal degradation caused by properties of insulating material between conducting material, the method comprising:
coupling a test structure to a processor, wherein the test structure comprises:
a first loop of conducting material, wherein the first loop has a first end and a second end;
a second loop of the conducting material, wherein the second loop has a third end and a fourth end;

a closed test loop of the conducting material made up of the second end connected to the third end and the first end connected to the fourth end;

a signal generator coupled to the first loop and the second loop, wherein the signal generator generates a test signal;

a signal propagation switching logic coupled to the first loop and to the second loop, wherein the signal propagation switching logic alternatingly flips the test signal between the first and second loops to permit the test signal to move uninterrupted through the closed test loop; and a probe logic for detecting a degradation of the test signal as the test signal travels along the closed test loop;

the signal generator initiating the test signal at the first end of the first loop;

the probe logic detecting a degraded test signal at the second end of the first loop;

the signal propagation switching logic flipping the degraded test signal to the third end of the second loop while flipping the fourth end of the second loop to zero;

the probe logic detecting a further degraded test signal at the fourth end of the second loop;

the signal propagation switching logic flipping the further degraded test signal to the first end of the first loop while flipping the second end of the first loop to zero; and repeating the detecting and flipping until a testing cycle is completed, wherein the degraded and further degraded test signals result from signal leakage from the conducting material into the insulating material.

2. The method of claim 1, wherein the test signal is a voltage, and wherein the degraded and further degraded test signals are a voltage drop of the test signal as the test signal travels through the closed test loop.

3. The method of claim 1, further comprising:
displaying the degraded and further degraded test signals.

4. A method of testing a signal degradation caused by properties of the conducting material, the method comprising:

coupling a test structure to a processor, wherein the test structure comprises:
a first loop having a first end and a second end;
a second loop having a third end and a fourth end;
a closed test loop made up of the second end connected to the third end and the first end connected to the fourth end;
a signal generator coupled to the first loop and the second loop, wherein the signal generator generates a test signal;
a signal propagation switching logic coupled to the first loop and to the second loop, wherein the signal propagation switching logic alternatingly flips the test signal between the first and second loops to permit the test signal to move uninterrupted through the closed test loop; and
a probe logic for detecting a degradation of the test signal as the test signal travels along the closed test loop;

the signal generator initiating the test signal at the first end of the first loop;

the probe logic detecting a degraded test signal at the second end of the first loop;

the signal propagation switching logic flipping the degraded test signal to the third end of the second loop while flipping the fourth end of the second loop to zero;

the probe logic detecting a further degraded test signal at the fourth end of the second loop;

the signal propagation switching logic flipping the further degraded test signal to the first end of the first loop while flipping the second end of the first loop to zero; and repeating the detecting and flipping until a testing cycle is completed, wherein the degraded and further degraded test signals result from properties of the conducting material.

5. The method of claim 4, wherein the test signal is a voltage, and wherein the degraded and further degraded test signals are a voltage drop of the test signal as the test signal travels through the closed test loop.

6. The method of claim 4, further comprising:
displaying the degraded and further degraded test signals.

* * * * *